United States Patent [19]

Liu

[11] Patent Number: 6,027,952
[45] Date of Patent: Feb. 22, 2000

[54] METHOD OF MANUFACTURING A STRING OF ELECTRICALLY CONNECTED LIGHT EMITTING DIODES

[76] Inventor: Ming-Hsun Liu, No. 7, Lane 68, Feng-Tung Rd., Feng-Yuan City, Taiwan

[21] Appl. No.: 09/307,242

[22] Filed: Jan. 21, 1997

[51] Int. Cl.[7] .................................................. H01L 21/60
[52] U.S. Cl. ............................. 438/26; 438/106; 445/23
[58] Field of Search ................................... 438/106, 107, 438/108, 109, 22, 25, 26, 28, 34; 257/81, 79, 99, 100; 313/500; 445/23

[56] References Cited

U.S. PATENT DOCUMENTS

| 5,485,479 | 1/1996 | Kitamura et al. | 438/26 |
| 5,516,727 | 5/1996 | Broom | 438/26 |
| 5,825,051 | 10/1998 | Bauer et al. | 257/99 |
| 5,825,054 | 10/1998 | Lee et al. | 257/99 |
| 5,828,172 | 10/1998 | Berthold et al. | 257/99 |

*Primary Examiner*—Savitri Mulpuri
*Attorney, Agent, or Firm*—Trop, Pruner, Hu & Miles, P.C.

[57] ABSTRACT

In a method of manufacturing a string of electrically connected light emitting diodes, there is provided a number of base members, each being made of an insulator material and including a base plate formed with a pair of first terminal holes, and a spaced pair of side walls that extend upwardly from the base plate and that confine a space therebetween. A work table is formed with a number of spaced recesses for receiving the base members therein. Each recess has a bottom formed with a pair of second terminal holes that are aligned with the first terminal holes in the respective base member. Each diode has a pair of terminals that are partially extended into the aligned first and second terminal holes in the respective base member and the respective recess. Each of a pair of electrical conductors has an insulating sheath around a conductive core, and extends through the spaces in the base members so as to be disposed between one of the terminals of the diodes and one of the side walls of the base members. The diodes are pushed toward the base members such that movement of the terminals further into the second terminal holes results in a cutting action of the terminals into the insulating sheaths to establish electrical contact between the terminals and the conductive cores of the electrical conductors.

5 Claims, 4 Drawing Sheets

METHOD OF MANUFACTURING A STRING OF ELECTRICALLY CONNECTED LIGHT EMITTING DIODES

BACKGROUND OF THE INVENTION

1. Field of the Invention

The invention relates to light emitting diodes, more particularly to a method of manufacturing a string of electrically connected light emitting diodes.

2. Description of the Related Art

Referring to FIG. 1, a conventional method of manufacturing a string of electrically connected light emitting diodes is shown to comprise the following steps:

providing a work table 1 having a working surface formed with a number of spaced recesses 1a (only one is shown);

providing a number of light emitting diodes 2 (only one is shown), each of which has a light emitting portion 2a that is inserted into a corresponding one of the recesses 1a and a pair of terminals 2b that extend from the light emitting portion 2a (only one terminal 2b is shown);

providing a pair of electrical conductors 3 (only one is shown), each of which has a conductive core 3a and an insulating sheath 3b around the conductive core 3a, the insulating sheath 3b being stripped at locations corresponding to the recesses 1a to form a number of exposed core portions;

welding each of the terminals 2b of the light emitting diodes 2 to one of the exposed core portions of an adjacent one of the electrical conductors 3; and cutting excess portions of the terminals 2b, providing a number of inverted U-shaped base members 4 (only one is shown), each of which covers the weld between the electrical conductors 3 and the terminals 2b of one of the light emitting diodes 2, and filling each of the base members 4 with glue 5 to secure the base members 4 onto the electrical conductors 3.

Some of the drawbacks of the aforementioned conventional method of manufacturing a string of electrically connected light emitting diodes are as follows:

1. Once assembled, the distance between the terminals 2b of a light emitting diode 2 in the base member 4 is relatively small. Accidental movement of one of the terminals 2b during assembly can lead to undesired contact between the terminals 2b, thereby resulting in a short-circuit condition. In addition, the presence of weld beads between the electrical conductors 3 and the terminals 2b of the light emitting diode 2 increases the risk of a short-circuit condition.

2. Since there are many light emitting diodes 2 on the electrical conductors 3, detection of a short-circuited one of the light emitting diodes 2 is a time-consuming process that is made possible only after cutting the electrical conductors 3 into several segments.

3. The insulating sheath 3b is manually stripped at locations corresponding to the recesses 1a to form the exposed core portions. Aside from using up a lot of time and manpower, the stripping operation may result in accidental damage to the conductive core 3a.

4. Manual welding of the terminals 2b of the light emitting diodes 2 onto the electrical conductors 3 is a slow and laborious process.

SUMMARY OF THE INVENTION

Therefore, the object of the present invention is to provide a method of manufacturing a string of electrically connected light emitting diodes, the method being easy and convenient to perform and minimizing the occurrence of short-circuiting, thus resulting in reduced costs.

Accordingly, the method of manufacturing a string of electrically connected light emitting diodes of the present invention comprises the steps of:

providing a number of base members, each of which is made of an insulator material and includes a base plate that is formed with a pair of first terminal holes, and a spaced pair of side walls that extend upwardly from the base plate and that confine a space therebetween;

providing a work table having a working surface formed with a number of spaced recesses, each of the base members being received in a respective one of the recesses, each of the recesses having a bottom formed with a pair of second terminal holes that are aligned with the first terminal holes in the respective one of the base members;

providing a number of light emitting diodes, each of which has a light emitting portion and a pair of terminals that extend from the light emitting portion and that are partially extended into the aligned first and second terminal holes in the respective one of the base members and the respective one of the recesses such that the light emitting portion is initially spaced apart from the respective one of the base members;

providing a pair of electrical conductors, each of which has a conductive core and an insulating sheath around the conductive core, each of the electrical conductors extending through the spaces in the base members and being disposed between a corresponding one of the terminals of the light emitting diodes and a corresponding one of the side walls of the base members;

pushing each of the light emitting diodes toward the respective one of the base members such that movement of the terminals further into the second terminal holes results in a cutting action of the terminals into the insulating sheaths to establish electrical contact between the terminals and the conductive cores of the electrical conductors while holding tightly the electrical conductors between the terminals of the light emitting diodes and the side walls of the base members; and removing the light emitting diodes, along with the base members and the electrical conductors, from the work table, cutting off excess portions of the terminals, and applying a layer of glue on a bottom side of the base plates of the base members.

Preferably, each of the base members has a partition that extends upwardly from the base plate between the side walls and that is parallel to the side walls so as to divide the space into two channels. Each of the first terminal holes is located in a respective one of the channels, and each of the electrical conductors extends through a respective one of the channels of the base members. The partition can prevent undesired electrical contact between the terminals of the respective one of the light emitting diodes to prevent occurrence of a short-circuit condition.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
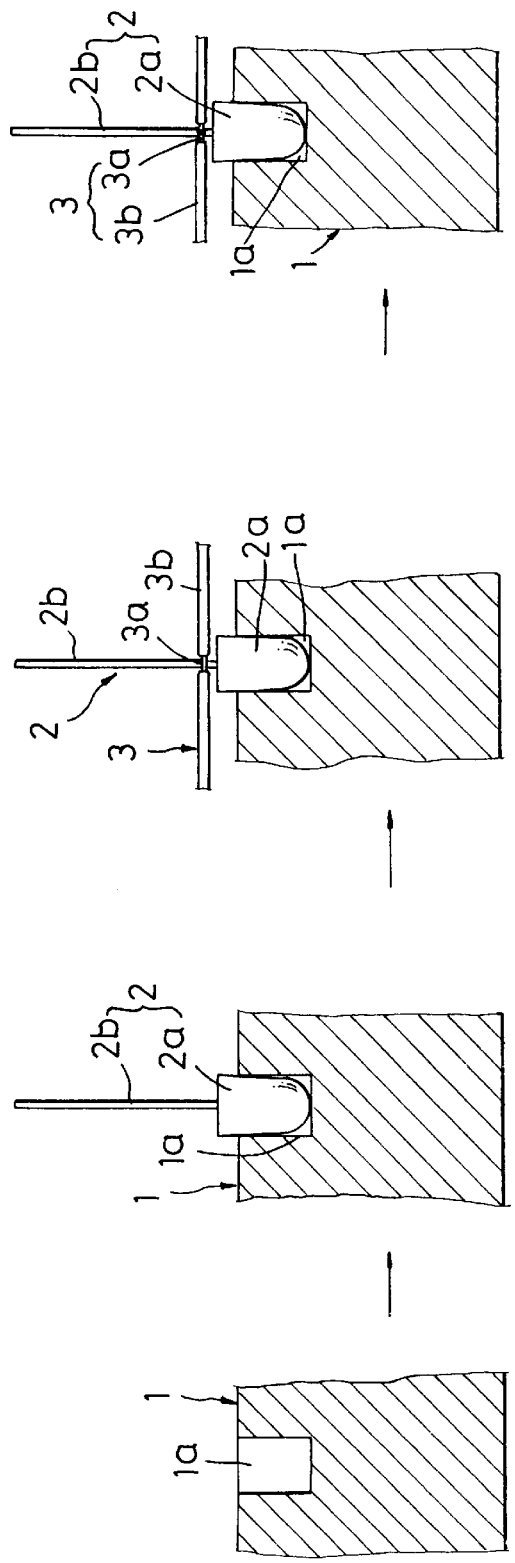
FIG. 1 is a schematic view which illustrates the steps of a conventional method of manufacturing a string of electrically connected light emitting diodes.
Figure 2:
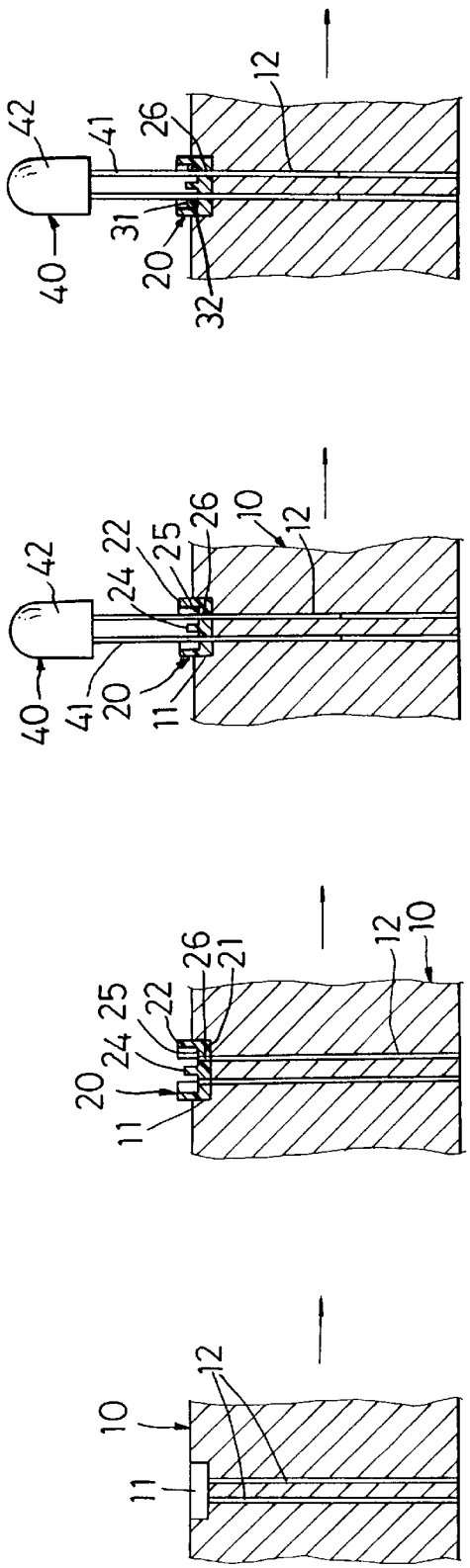
FIG. 2 is a schematic view which illustrates the steps of the preferred embodiment of a method of manufacturing a string of electrically connected light emitting diodes in accordance with the present invention.
Figure 2:
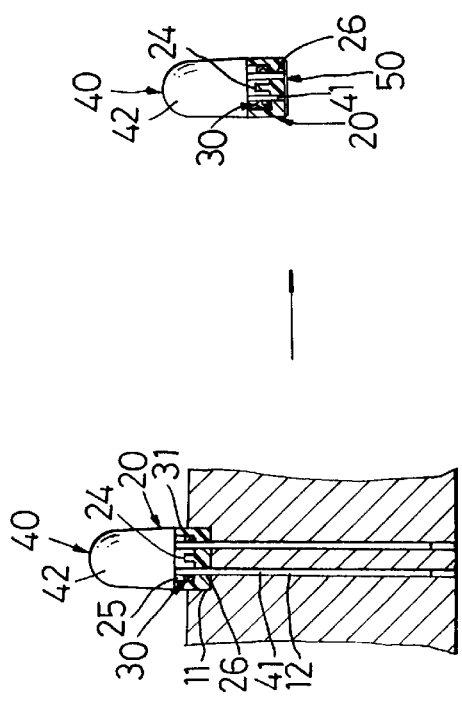
Figure 3:
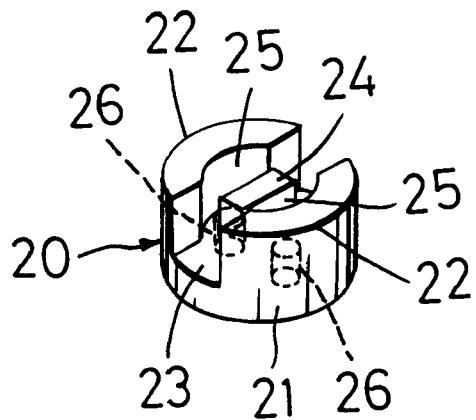
FIG. 3 is a perspective view of a base member that is employed in the preferred embodiment.
Figure 4:
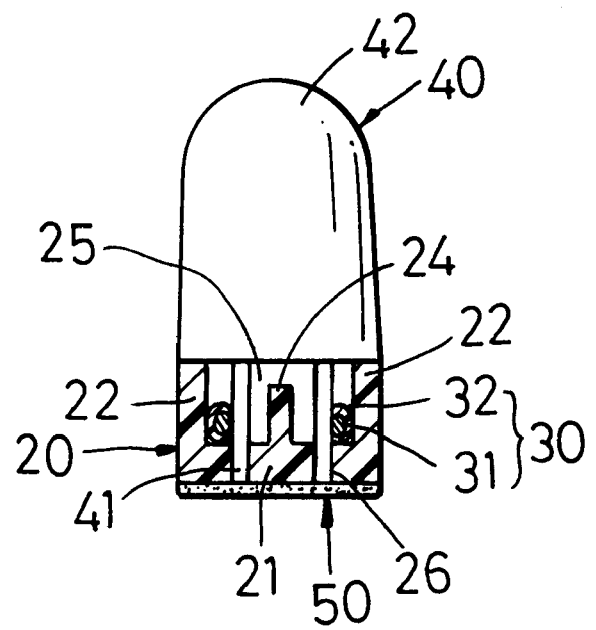
FIG. 4 is a schematic partly sectional view illustrating the connection between a light emitting diode and a pair of electrical conductors in accordance with the preferred embodiment.
Figure 5:
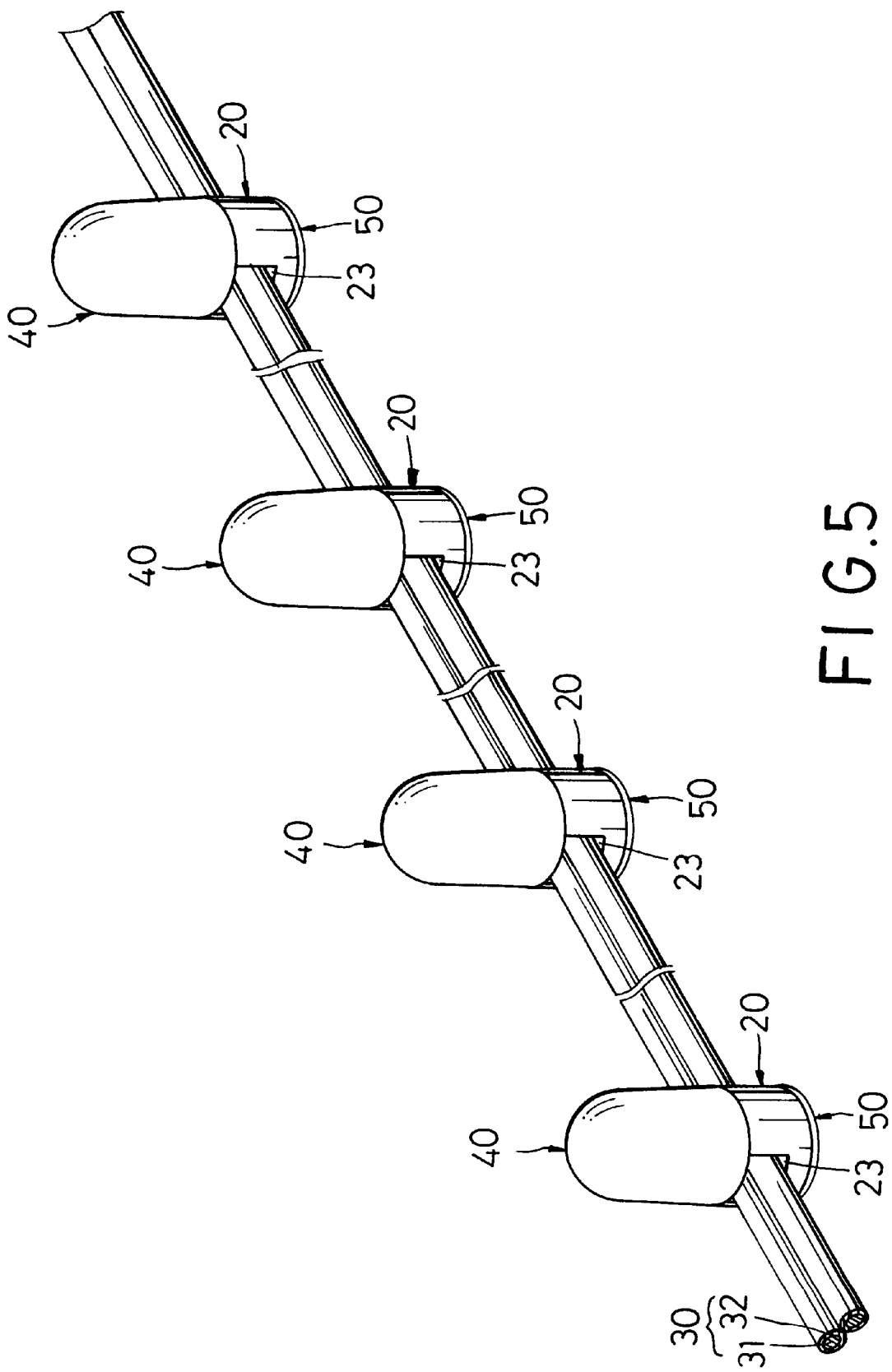
FIG. 5 is a perspective view of a string of electrically connected light emitting diodes that is manufactured in accordance with the preferred embodiment.

Referring to FIGS. 2 to 5, the preferred embodiment of a method of manufacturing a string of electrically connected light emitting diodes according to the present invention is shown to comprise the following steps:

1. A number of base members 20 is provided. Each base member 20 is made of an insulator material and includes a base plate 21 and a spaced pair of complementary curved side walls 22 that extend upwardly from the base plate 21 and that confine a space 23 therebetween. A partition 24 extends upwardly from the base plate 21 between the side walls 22 and is parallel to the latter so as to divide the space 23 into two channels 25. The base plate 21 is formed with a pair of first terminal holes 26, each of which is located in a respective one of the channels 25.

2. A work table 10 having a working surface formed with a number of spaced recesses 11 is provided. The recesses 11 receive a respective one of the base members 20 therein and are shallower than the height of the side walls 22. Each of the recesses 11 has a bottom formed with a pair of second terminal holes 12 that are aligned with the first terminal holes 26 in the respective one of the base members 20.

3. A number of light emitting diodes 40 is provided. Each of the light emitting diodes 40 has a light emitting portion 42 and a pair of terminals 41 that extend from the light emitting portion 42 and that are partially extended into the aligned first and second terminal holes 26, 12 in the respective one of the base members 20 and the respective one of the recesses 11 such that the light emitting portion 42 is initially spaced apart from the respective one of the base members 20.

4. A pair of electrical conductors 30 is provided, each of which has a conductive core 31 and an insulating sheath 32 around the conductive core 31. Each of the electrical conductors 30 extends through a respective one of the channels 25 of the base members 20 and is disposed between a corresponding one of the terminals 41 of the light emitting diodes 40 and a corresponding one of the side walls 22 of the base members 20. Since the base member 20 is made of an insulator material, the partition 24 can prevent undesired electrical contact between the terminals 41 of the light emitting diodes 40 to prevent occurrence of a short-circuit condition.

5. Each of the light emitting diodes 40 is pushed downwardly toward the respective one of the base members 20 until the light emitting portions 42 of the former rest on the latter. Downward movement of the light emitting diodes 40 results in corresponding movement of the terminals 41 further into the second terminal holes 12, and in a cutting action of the terminals 41 into the insulating sheaths 32 to establish electrical contact between the terminals 41 and the conductive cores 31 of the electrical conductors 30. In addition, the electrical conductors 30 are held tightly between the terminals 41 of the light emitting diodes 40 and the side walls 22 of the base members 20, thereby resulting in a secure and stable connection.

6. The light emitting diodes 40, along with the base members 20 and the electrical conductors 30, are removed from the work table 10. The excess portions of the terminals 41 are cut, and a layer 50 of glue is applied on a bottom side of the base plates 21 of the base members 20 for insulating and aesthetic purposes.

The advantages of the method of the present invention are as follows:

1. After assembly, even though the distance between the terminals 41 of a light emitting diode 40 in the base member 20 is relatively small, the presence of the partition 24 in the base member 40 can prevent undesired contact between the terminals 41, thereby avoiding the occurrence of a short-circuit condition.

2. Since occurrence of a short-circuit condition is minimized, the need for detecting short-circuited ones of the light emitting diodes 40 can be avoided.

3. There is no need to strip the insulating sheaths 32 of the electrical conductors 30, thereby resulting in a faster manufacturing process and in the prevention of accidental damage to the conductive cores 31.

4. Manual welding of the terminals 41 of the light emitting diodes 40 onto the electrical conductors 30 is not required.

It has thus been shown that the present invention provides a manufacturing method that is both easy and convenient to perform and that can minimize the occurrence of short-circuiting, thereby resulting in reduced costs. The object of the present invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A method of manufacturing a string of electrically connected light emitting diodes, comprising the steps of:

providing a number of base members, each of which is made of an insulator material and includes a base plate that is formed with a pair of first terminal holes, and a spaced pair of side walls that extend upwardly from the base plate and that confine a space therebetween;

providing a work table having a working surface formed with a number of spaced recesses, each of the base members being received in a respective one of the recesses, each of the recesses having a bottom formed with a pair of second terminal holes that are aligned with the first terminal holes in the respective one of the base members;

providing a number of light emitting diodes, each of which has a light emitting portion and a pair of terminals that extend from the light emitting portion and that are partially extended into the aligned first and second terminal holes in the respective one of the base members and the respective one of the recesses such that the light emitting portion is initially spaced apart from the respective one of the base members;

providing a pair of electrical conductors, each of which has a conductive core and an insulating sheath around the conductive core, each of the electrical conductors extending through the spaces in the base members and being disposed between a corresponding one of the terminals of the light emitting diodes and a corresponding one of the side walls of the base members; and pushing each of the light emitting diodes toward the respective one of the base members such that movement of the terminals further into the second terminal holes results in a cutting action of the terminals into the insulating sheaths to establish electrical contact between the terminals and the conductive cores of the electrical conductors while holding tightly the electrical conductors between the terminals of the light emitting diodes and the side walls of the base members.

2. The method of claim 1, further comprising the steps of:

removing the light emitting diodes, along with the base members and the electrical conductors, from the work table;

cutting off excess portions of the terminals; and applying a layer of glue on a bottom side of the base plates of the base members.

3. The method of claim 1, wherein each of the base members has a partition that extends upwardly from the base plate between the side walls and that is parallel to the side walls so as to divide the space into two channels, each of the first terminal holes being located in a respective one of the channels, each of the electrical conductors extending through a respective one of the channels of the base members, whereby the partition can prevent undesired electrical contact between the terminals of the respective one of the light emitting diodes to prevent occurrence of a short-circuit condition.

4. The method of claim 1, wherein each of the recesses is shallower than the height of the side walls of the respective one of the base members.

5. The method of claim 4, wherein the light emitting diodes are pushed toward the respective one of the base members until the light emitting portions of the light emitting diodes rest on the base members.

* * * * *